United States Patent [19]

Sokira

[11] Patent Number: 5,057,383
[45] Date of Patent: Oct. 15, 1991

[54] BATTERY SYSTEM
[75] Inventor: Thomas J. Sokira, Cheshire, Conn.
[73] Assignee: Anton/Bauer, Inc, Shelton, Conn.
[21] Appl. No.: 502,557
[22] Filed: Mar. 30, 1990
[51] Int. Cl.[5] .......................................... H01M 10/48
[52] U.S. Cl. ...................................... 429/92; 429/93; 429/98
[58] Field of Search ................. 429/7, 91-93, 429/98; 248/225.31, 309.1

[56] References Cited

U.S. PATENT DOCUMENTS

| | | | |
|---|---|---|---|
| 2,024,281 | 12/1935 | Gaskin | 248/225.31 X |
| 3,960,353 | 6/1976 | Leutwyler | 248/309.1 X |
| 4,553,081 | 11/1985 | Koenck | 320/39 X |
| 4,618,915 | 10/1986 | Bury | 248/309.1 X |
| 4,696,449 | 9/1987 | Woo et al. | 248/309.1 X |
| 4,910,103 | 3/1990 | Yoshikawa et al. | 429/92 X |

Primary Examiner—Stephen J. Kalafut
Attorney, Agent, or Firm—Kramer, Bufsky & Cifelli,

[57] ABSTRACT

A battery system includes a battery pack having a plurality of batteries and electronic circuitry for monitoring battery parameters and producing an analog output signal related to the state of the charge in the batteries. An attachment is detachably mounted on the battery pack and produces a display indicating the state of charge in the batteries using the analog output signal from the battery pack. The attachment which includes a bracket and a display unit also serves as connector for connecting the battery pack to the device which is to be powered by the battery pack.

18 Claims, 8 Drawing Sheets

BATTERY SYSTEM

BACKGROUND OF THE INVENTION

The present invention relates generally to battery systems and more particularly to battery systems of the type which include a battery pack having a set of rechargeable batteries and electronic circuitry for monitoring battery parameters.

A battery system which includes a battery pack with a microprocessor is disclosed in U.S. Pat. No. 4,289,836 to Lemleson. The microprocessor monitors battery parameters such as the state of battery charge, number of charging cycles, battery temperature, and battery pressure. The microprocessor may also be used to control a display for the battery parameters. The battery pack is coupled to a simple power supply for recharging purposes.

Another battery system which includes a battery pack with a microprocessor is disclosed in U.S. Pat. No. 4,553,081 to Koenck. The microprocessor monitors battery operation to determine remaining battery capacity and counts the number of shallow discharges and successive recharging cycles to estimate deterioration of the battery. Circuitry within the battery pack occasionally causes a discharge of the battery to determine present battery capacity. The microprocessor and other circuitry require little operating power so that the shelf-life of the battery pack is long. The microprocessor is also coupled to a display for indicating battery capacity and other information obtained from the battery. The battery pack also includes several I/O ports to communicate with a portable computer terminal device and a battery charger.

It is a general object of this invention to provide a new and improved battery system.

SUMMARY OF THE INVENTION

A battery system constructed according to the teachings of the present invention includes a battery pack having a set of rechargeable batteries and electronic circuitry for monitoring battery parameters and producing an analog electrical signal whose amplitude is related to the charge remaining in the batteries. The battery system further includes an attachment for providing a display indicating the charge remaining in the batteries using the analog electrical signal produced by the electronic circuitry in the battery pack. Two versions of the attachment are disclosed, one intended for use with the battery pack when it is to be coupled to a device to be powered by the batteries and the other to be used when the battery pack is not coupled to any device. The battery system further includes a battery charger for recharging the batteries in the battery pack.

Various features and advantages will appear from the description to follow. In the description, reference is made to the accompanying drawing which forms a part thereof, and in which is shown by way of illustration a specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

DETAILED DESCRIPTION OF THE PREFERRED EMBODIMENTS

Figure 1:
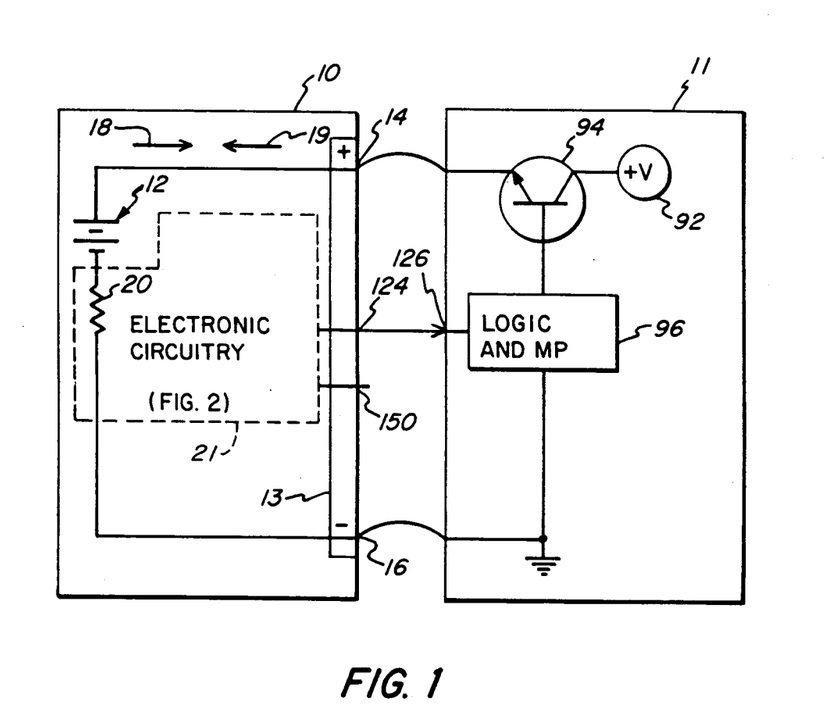
FIG. 1 is a simplified circuit diagram of a battery pack and an associated battery charger according to this invention.

Referring now to the figures in detail wherein like reference numerals indicate like elements throughout the several views, FIG. 1 illustrates in simplified schematic form a battery pack 10 and an associated battery charger 11. Battery pack 10 includes a plurality of rechargeable battery cells 12 and, by way of example, there are ten to twelve such cells of the nickle cadmium type, each cell being 1.2 volts. Collectively, battery cells 12 may have a capacity of either two ampere-hours or four ampere-hours. Battery pack 10 further includes a connector 13 having positive terminal 14 and a negative or return terminal 16 to receive charging current from and return charging current to battery charger 11. The positive terminal 14 also can deliver current to a load (not shown).

When battery cells 12 deliver current to the load, the current flows in the direction indicated by an arrow 18. Conversely, when battery cells 12 are charged, current flows in the direction indicated by an arrow 19. Either current develops a voltage across a resistor 20 which is connected in series with the battery terminals and cells. To minimize power dissipation in the resistor 20, the resistor is small, for example, 0.025 ohms.

Figure 2:
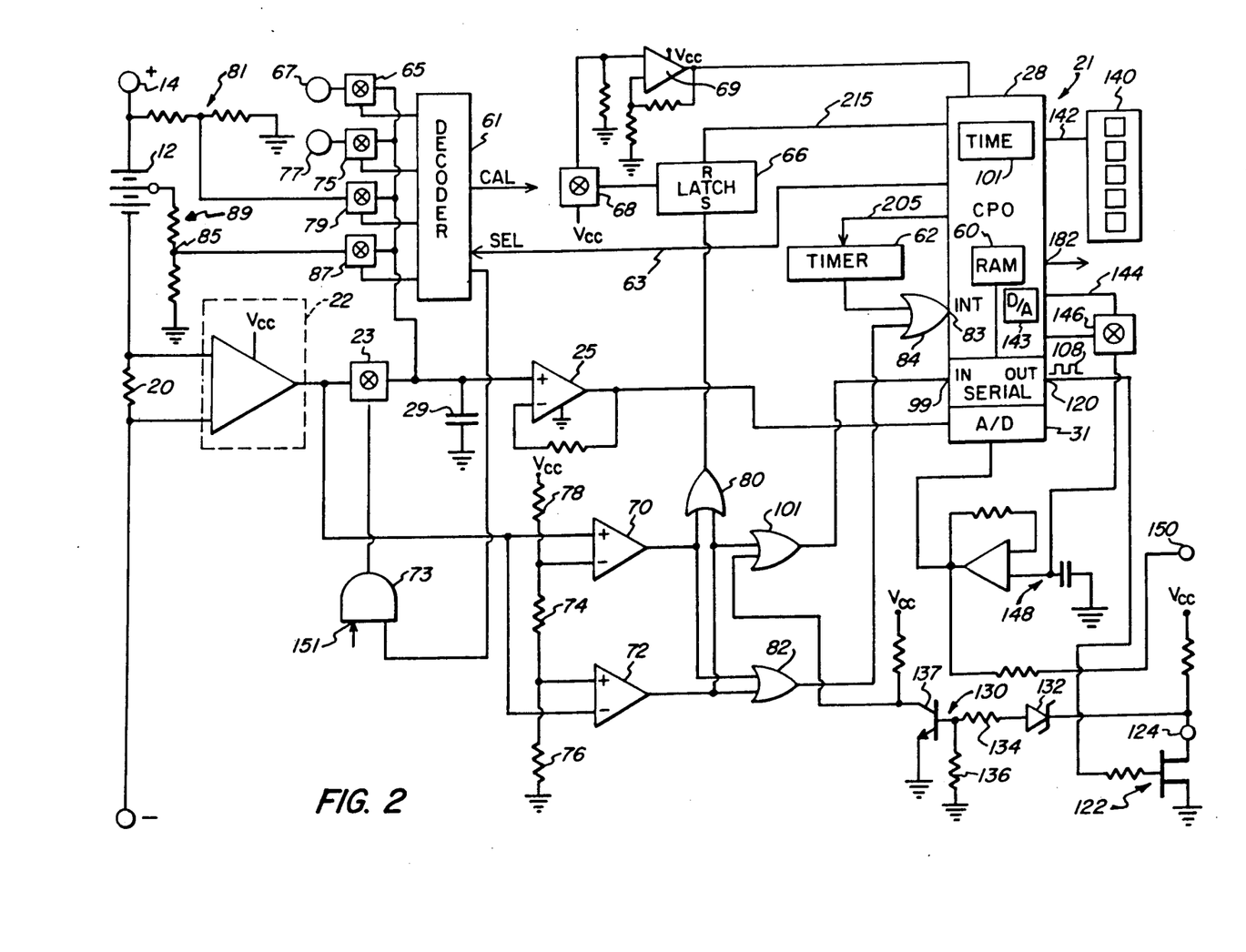
FIG. 2 is a more detailed circuit diagram of the battery pack of FIG. 1.

Battery pack 10 further includes electronic circuitry 21 for monitoring battery parameters, electronic circuitry 21 being illustrated in more detail in FIG. 2. Circuitry 21 includes a differential amplifier 22 which has inputs connected across the resistor 20 to sense the instantaneous charge or discharge current. The output of amplifier 22 is applied through a switch 23 and a buffer amplifier 25 to the input of an A/D converter 31 within a CPU 28. As described in more detail below, CPU 28 reads the output of A/D converter 21 to determine the state of charge of the battery cells based on the measured charge and discharge currents.

In order to minimize power dissipation by electronic circuitry 21, CPU 28 is a type which is capable of entering into a non-functional "light-sleep" mode in which power is disconnected from most of the electronic circuitry within CPU 28 and CPU 28 cannot monitor battery parameters. Motorolla Model MC68HC11 is such a type. CPU 28 is programmed to enter into the light-sleep mode when there is neither charging nor discharging activity for predetermined period, for example, one hour. A timer 101 within CPU 28, which may comprise a register incremented with the passage of time, measures the inactive time as described in more detail below. CPU 28 includes a non-volatile RAM 60 which stores battery parameter at indicating the amount of discharge of the battery cells 12, the number of discharge and recharging cycles, the highest temperature that either the battery cells or the battery pack 10 has ever experienced, and the type and serial number of the battery. During the light-sleep, power is supplied to a timer 62 external to the CPU which periodically "wakes-up" the entire CPU 28 every 250 milliseconds to enable CPU 28 to lead the output of the A/D converter 31 to determine the amount of instantaneous charge or discharge current, if any. If amplifier 22 indicates battery discharge, the CPU approximates the ampere-hour discharge during the previous 250 millisecond interval. By way of example, to estimate the amount of discharge between the readings, CPU 28 may multiply the discharge current times 250 milliseconds. Then, CPU 28 calculates the remaining charge in the battery cells 12 by subtracting the amount of discharge between the readings from the battery charge calculated at the previous reading.

When awake, CPU 28 also monitors the temperature of the battery cells by commanding selection decoder 61 via lines 63 to activate a switch 65 coupled to temperature sensor 67 so that the signal provided by temperature sensor 67 is supplied to the input of buffer 25. Simultaneously, CPU 28 directs decoder 61 to disable switch 23 via gate 73. CPU 28 then reads the temperature from the A/D converter. Next, CPU 28 activates switch 75 by appropriate commands on lines 63 to interconnect battery pack, surface temperature sensor 77 to the input of buffer 25 while simultaneously disabling switches 23 and 65. Next, CPU 28 enables switch 79 to interconnect the positive terminal 14 of the battery pack via voltage divider 81 to the input of buffer 25 while disabling the other switches so that CPU 28 can monitor the combined voltage of the battery cells. Then, CPU 28 activates a switch 87 to interconnect a voltage tap 85, which sensors the voltage of half of the battery cells, to the buffer 25 via a voltage divider 89 while disabling the other switches.

During the light-sleep and functional modes of operation, power is supplied to CPU 28 via a switch 68 and a buffer amplifier 69. CPU 28 continuously repeats the foregoing cycles of light-sleep and periodic awakening until either CPU 28 detects charging or discharging activity, or the cell voltage drops below a predetermined level. If the voltage drops below this low level, CPU 28 transmits a reset pulse to a latch 66 which opens the switch 68 and thereby prevents the delivery of power to CPU 28. Consequently, CPU 28 enters into a "deep-sleep" mode. By way of example, during light-sleep CPU 28 draws approximately 20% of the power that it draws during the functional, "awake" mode, and during "deep-sleep", CPU 28 draws essentially no power. However, as noted above, during deep-sleep, the data is retained in the non-volatile RAM 60.

During the light-sleep and deep-sleep modes, power is still applied to the amplifier 22 and to comparators 70 and 72, which amplifier and comparators are capable of awakening CPU 28 from either deep-sleep or light-sleep during charging or discharging. An input of each of the comparators is connected to the output of the amplifier 22. The other, negative input of comparator 70 is provided with a threshold voltage determined by the magnitude of resistors 74 and 76 in relation to the magnitude of resistor 78. The other, positive input of comparator 72 is provided with a threshold voltage determined by the magnitude of resistor 76 in relation to the magnitudes of resistors 74 and 78.

When the battery system is connected to a load, a voltage develops across the resistor 20. The voltage is sensed by the amplifier 22 and applied to the comparator 70. If the voltage is above the threshold level, comparator 70, transmits a binary 1 set signal to the latch 66 via OR gate 80. This resumes the supply of power to CPU 28 if it was in deep-sleep. Comparator 70 also transmits a binary 1 signal to interrupt port 83 of the CPU via OR gates 82 and 84. This awakens CPU 28 from light-sleep if it was in light-sleep and directs CPU 28 to read the A/D converter and thus, the discharge current. CPU 28 remains in the functional, awake mode for a predetermined period in which it continuously monitors the discharge. After the predetermined period which, for example, is one hour after the cessation of discharge, CPU 28 returns to the light-sleep and periodic awakening mode in which timer 62 is used to awaken CPU 28. One reason that both timer 62 and comparator 82 are used to awaken CPU 28 from light-sleep is that the comparator is preferably a CMOS or other low power type and may not be sensitive to small discharge currents while the amplifier 22 is sensitive and the timed awakening is useful to monitor such small discharge.

Battery charger 11 includes a source 92 of voltage and an electronic switch 94 (see FIG. 1) which couples voltage source 92 to the positive terminal 14 of battery pack 10. Thus, when battery charger 11 delivers current to positive terminal 14, current flows into battery cells 12 and across resistor 20 in the direction indicated by arrow 19, as noted above. A corresponding voltage is developed across the input of amplifier 22 and comparator 72. This voltage is greater than the threshold voltage of comparator 72 so that the comparator supplies a binary 1 set pulse to latch 66 via OR gate 80 which resumes the supply of power to CPU 28 (if it was in deep-sleep) via switch 68 and buffer 69. Comparator 72 also supplies a binary 1 signal to interrupt port 83 via OR gates 82 and 84. As noted above, the signal applied to interrupt port 83 awakens CPU 28 from light-sleep if it was in light-sleep and directs the CPU to read the A/D converter. Comparator 72 also outputs to a serial data input port 99 via OR gate 101, and if A/D converter 31 indicates that the battery is receiving current in the polarity of charge, CPU 28 reads the serial data input port 99.

Figure 3:
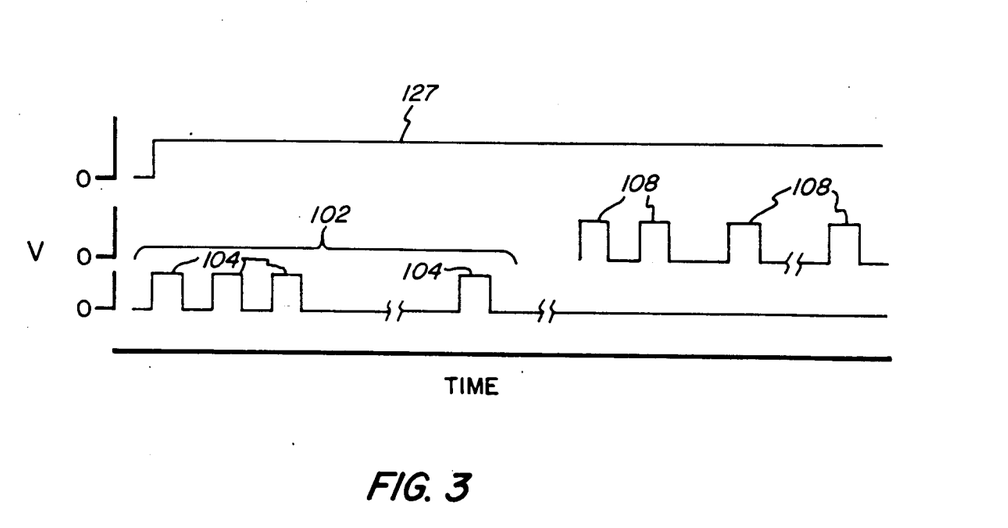
FIG. 3 is a timing diagram illustrating digital communication between the battery charger and battery pack of FIG. 1.

As illustrated in FIG. 3, when battery pack 10 is installed in battery charger 11, the battery charger can transmit a code 102 to CPU 28 requesting specific battery parameter data by delivering current pulses 104 into the positive terminal 14. The current pulses cause voltage pulses to develop across resistor 20 and at the outputs of amplifier 22 and comparator 72. These voltage pulses, as noted above, are supplied to the serial data input port 99 of CPU 28. Thus, CPU 28 is awakened by the onset of the first pulse 104 of code 102 by setting of latch 66 (if necessary) and activation of interrupt port 80, and alerted to read the subsequent data. By way of example, the code 102 includes a start bit, a stop bit, and 8 intervening data bits specifying the requested battery parameter data. Code 102 instructs CPU 28 to transmit battery parameter data to the logic and microprocessor (mp) circuitry 96 within battery charger 11. This data is the data contained within the non-volatile RAM 60 and, as noted above, includes the amount of discharge of the battery, the battery capacity, the number of charging/recharging cycles, the highest battery cell or surface temperature that the battery has experienced, the type of battery, and the serial number of the battery. CPU 28 transmits the requested information by outputting serial data pulses 108 from output port 120 and through FET buffer 122 and battery pack port 124. The data is received by battery charger 11 at input port 126. Then, battery charger 11 may request additional information by transmitting the respective code into positivde terminal 14.

CPU 28 is also programmed to transmit all of its battery parameter data to output port 124 in a predetermined order after the onset of receipt of charge current 127 if no specific data request current is received.

After battery charger 11 receives all the data it requires, it charges battery cells 12 by delivering charging current to positive terminal 14 in accordance with the state of charge of the battery cell 12, the type of battery, and the temperatures of the cells and battery pack surface. For example, if the battery is substantially discharged and within a safe charging temperature range, charger 11 supplies a maximum charging current. However, if battery cells 12 are nearly fully charged or above the temperature range, then charger 11 supplies a lesser current. Charging techniques suitable for the battery pack 10 and battery charge 11 are described in commonly assigned U.S. patent application Ser. No. 115,155 entitled "Battery Charging System" filed Oct. 30, 1987 by George W. Bauer et al, now U.S. Pat. No. 4,849,682, and U.S. Pat. No. 4,554,500 to Sokira issued Nov. 19, 1985, which patent application and patent are hereby incorporated by reference as part of the present disclosure.

It should be appreciated that positive terminal 14 serves to route operating current from battery cells 12 to an actual load, route data from battery charger 11 to CPU 28 and route charging current from the battery charger to battery cells 12.

During charging of the battery pack 10, CPU 28 is continuously awake and functional to accurately monitor the charging current.

Electronic circuitry 21 further includes a communication link 130 comprising a zener diode 132, input resistors 134 and 136 and transistor 137 which link receives data to port 124 and transmits it to the serial data input port 99 of CPU 28 via OR gate 101. This communication link may be used at the factory or during service to transmit a code to the CPU to elicit types of battery chargers may not be equipped to transmit data to the CPU via port 124 and communication link 130 so that transmission of a data request into terminal 14 either by a specific data code or by the onset of charging current is important.

Battery pack 10 may also include an LCD bar graph 140 which receives information from CPU 28 via lines 142 indicating the amount of charge remaining in the batteries and displays this information.

CPU 28 also outputs through an eight bit D/A converter 143 via line 144 an analog signal representing the charge remaining in the batteries. The signal applied to D/A converter 143 is obtained from a register in CPU 28 (not shown) which is incremented up or down as the batteries 12 charge or discharge, respectively. The register carries a hexidecimal value of 1.0 which is equivalent to a decimal value of 16. Thus, for example, when batteries 12 are 50% discharged the register will carry a value of 8. The output signal is a DC voltage with 16 discrete steps from 0 to 5 volts with zero volts being empty and five volts being full charge. The signal is sent through a switch 146 to a sample and hold circuit 148 and from there to an output fuel gauge port 150 on connector 13. The analog output signal at port 150 of the battery pack 10 may be transmitted to a meter which may be incorporated within a video camera or other device powered by battery pack 10 or may be transmitted to a display unit separate from battery pack 10 and the device being powered by battery pack 10 as will hereinafter be described. The output of sample and hold circuit 148 is also fed back to A/D converter 31 over line 151 for calibration purposes.

Figure 5A:
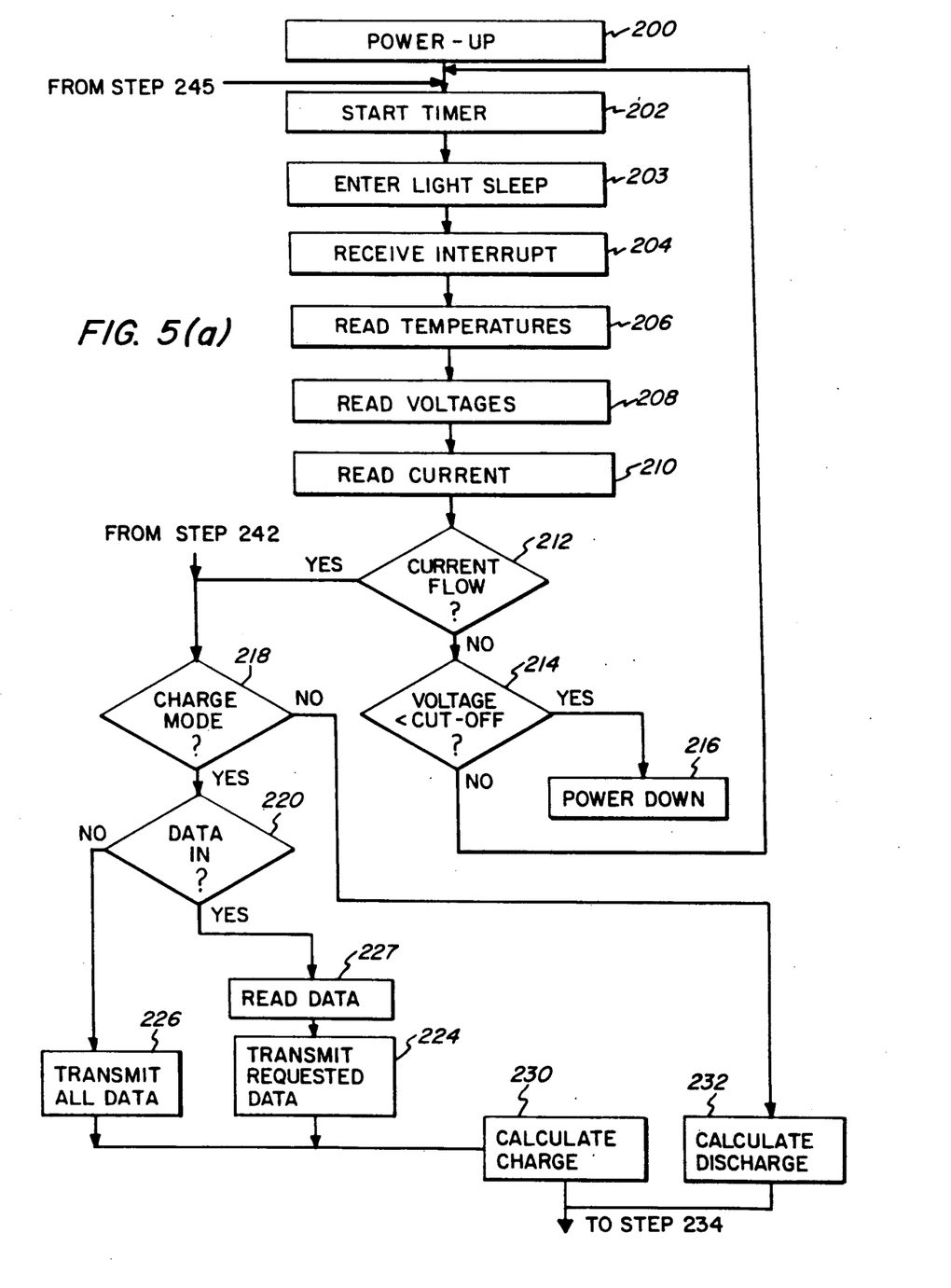
FIG. 5 is a flow chart illustrating operation of a microprocessor and the other electronic circuitry of FIG. 2.
Figure 5B:
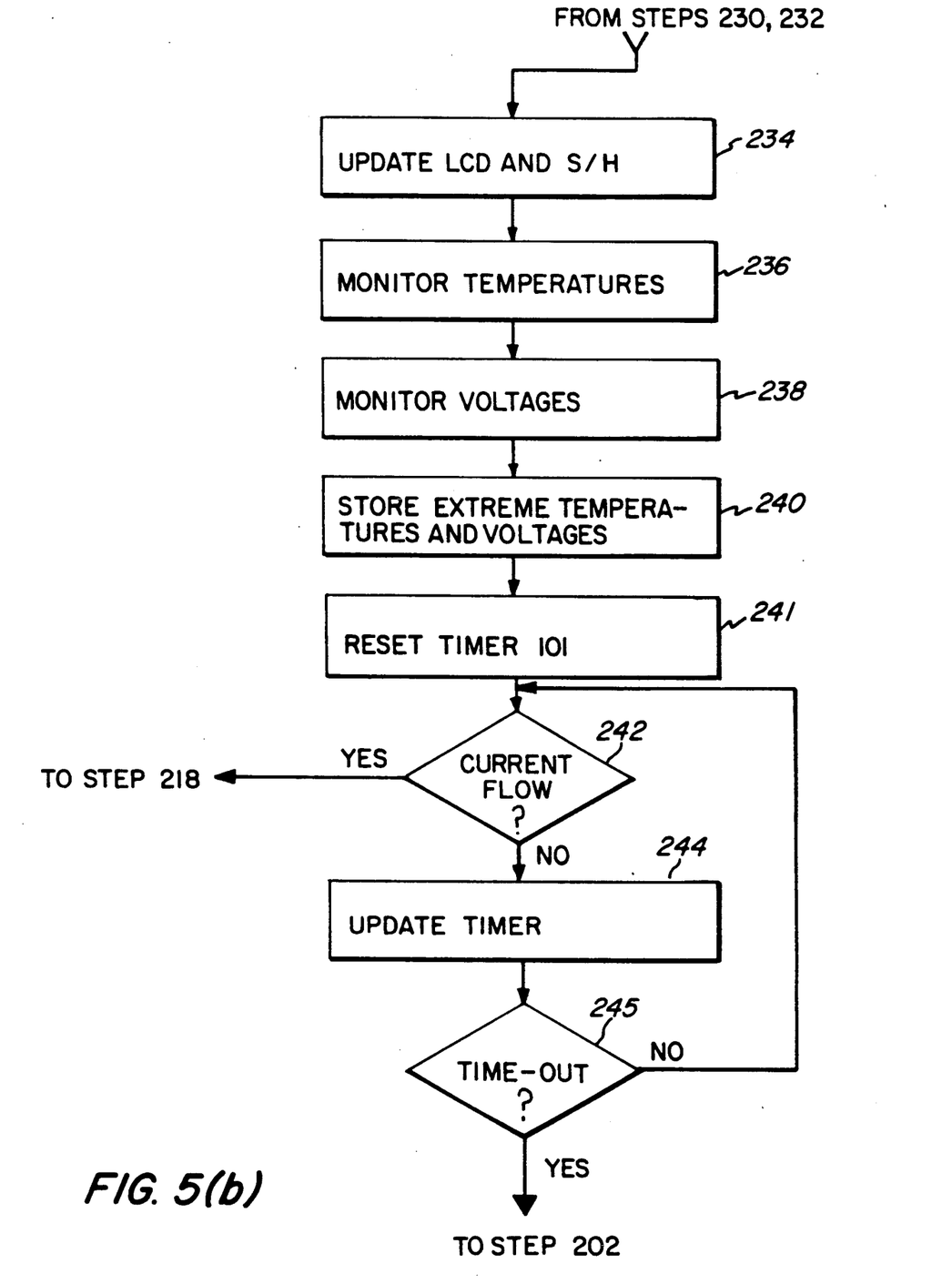

FIGS. 5(a) and 5(b) form a flow chart illustrating the operation of CPU 28 and associated circuitry. To begin the operation, the system is powered-up by the application of power to CPU 28 (step 200) by setting of latch 66 as noted above. Then, the CPU starts the timer 62 (step 202) by transmitting a pulse on line 205 (see FIG. 2) and enters into the non-functional, light-sleep mode (setp 203). Next, a pulse is applied to interrupt port 83 either by the timer, comparator 70 or comparator 72 (setp 204). As noted above, comparator 70 transmits such a pulse to interrupt port 83 upon discharge of the battery and comparator 72 transmits such a pulse to interrupt port 83 upon charge of the battery. After any of the three events, CPU 28 awakens from the light or deep-sleep, reads the temperature sensors 67 and 77, the full battery voltage, and the half battery voltage to determine if the battery is within safe operating limits (steps 206 and 208). Next, CPU 28 reads the charge or discharge current by reading A/D converter 31 (step 210). If no current is flowing at the time, CPU 28 determines whether the overall battery voltage is less than the low, cut-off level which represents the specified usable limit of the battery pack (step 214). If the battery voltage is below this level, the CPU transmits a rest pulse on line 215 to latch 66 to power-down CPU 28. If not, CPU 28 (step 216) loops back to step 202 to start the timer again.

Referring to step 212, if current was flowing at the time, CPU 28 determines whether the current is in the charge or discharge mode (step 218) by reading the output of A/D converter. If in the charge mode, CPU 28 proceeds to step 220 in which it determines whether data is being transmitted into terminal 14. If so, the CPU reads the data (step 227) and in response, transmits the requested information via output port 124 (step 224). If, on the other hand, the charging current was simply charging current and did not contain variable data, CPU 28 proceeds from step 220 to step 226 in which it transmits all relevant data in a predetermined order to output port 124. After the transmission of data in either step 224 or step 226, CPU 28 calculates the amount of charge of the battery pack (step 230).

Returning again to step 218, if amplifier 22 indicated that the battery is being discharged instead of charged, step 218 leads to step 232 in which CPU 28 calculates the amount of discharge of the battery cells (step 232).

After either of steps 230 and 232, CPU 28 updates the LCD display 140 and the sample and hold circuit 148 with the current state of charge of the battery (step 234).

Next, CPU 28 again monitors the temperature sensors 67 and 77 and the full battery voltage and half battery voltage (steps 236 and 238). CPU 28 also stores data indicating the extreme temperatures and voltages to which the battery pack has been exposed (step 240). Then, CPU 28 resets the timer 101 (step 241).

Next, CPU 28 reads the output of A/D converter 31 to determine if there is additional current flowing through the battery cells (step 242), and if so, loops back to the step 218 to monitor the charge or discharge as the case may be. If not, CPU 28 loops from step 242 to a step 244 in which it updates the timer 101. Until the timer times out as noted in step 245, step 245 leads back to step 242 in which CPU 28 reads the output of A/D converter 31 to determine if current is flowing. Thus, if no current flows for the duration of the timer, for example, one hour, then step 245 leads back to step 202 in which CPU 28 starts timer 62 and enters again into the light-sleep mode. As noted above, this conserves power because most of the power to CPU 28 is turned off until the interrupt pulse is generated at the interrupt port 83 in step 204. This begins another iteration of the flow chart.

Figure 4:
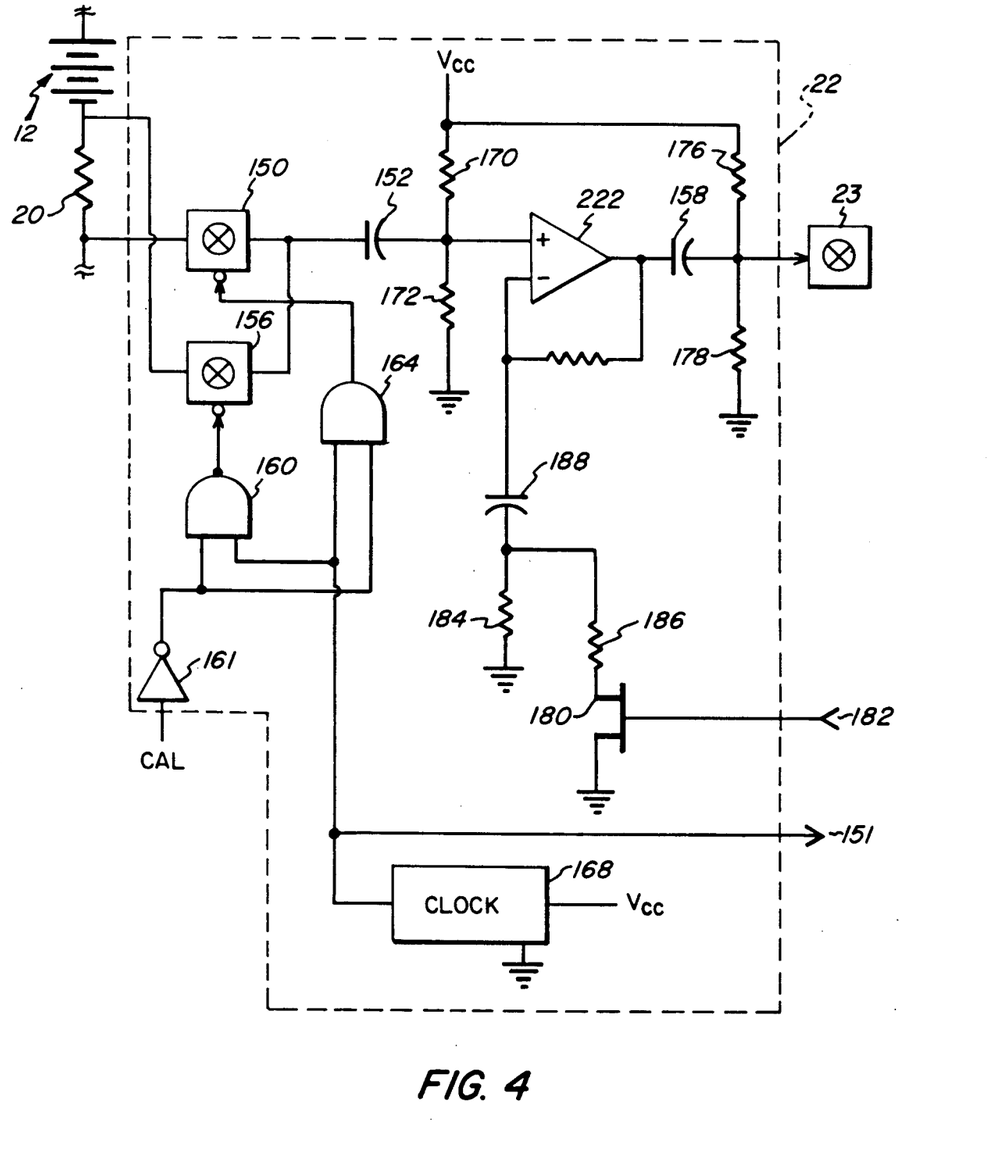
FIG. 4 is a schematic circuit diagram of an amplifier within the battery pack.

FIG. 4 illustrates one type of design for the amplifier 22. According to this design, the amplifier is a switching type and includes associated circuitry as follows. One side of resistor 20 is connected to a positive input of an amplifier 222 via a switch 150 and a series capacitor 152. The other side of resistor 20 is connected to the same input of amplifier 122 via a switch 156 and the capacitor 152. The output of amplifier 222 is supplied through another series capacitor 158 to the switch 23 en route to buffer 25 and A/D converter 21 of CPU 28. To calilbrate amplifier 222, the CPU directs the selection decoder 61 to transmit a binary 1 calibrate pulse ("CAL") to the input of inverter gate 161 and a binary 1 pulse to AND gate 73 (see FIG. 2). Consequently, a binary zero pulse is sent to the inputs of NAND gate 160 and AND gate 164, and switch 156 is opened and switch 150 is closed. A square wave clock 168 supplies the other inputs of NAND gate 73. Consequently, a reference voltage of the battery pack is supplied through switch 150 to a first side of capacitor 152. The other side of capacitor 152 is connected between resistors 170 and 172 which are identical to each other. The resistor 172 is connected to $V_{cc}$ so that a zero current reference voltage of $V_{cc}/2$ is supplied to the positive input of amplifier 222. Resistors 176 and 178 are identical to the resistors 170, 172 and similarly center the output voltage provided by amplifier 222 through capacitor 158. Resistors, 170, 172, 176 and 178 are provided to center the zero current so that the A/D converter can indicate both positive and negative voltages associated with charging and discharging current. Then, when the clock outputs a positive pulse to input 151 of gate 73, switch 23 supplies the reference voltage to A/D converter 36 via buffer 25. CPU 28 reads and stores the reference voltage.

It should also be noted that amplifier 222 is capable of two voltage gain ranges. When a transistor 180 is deactivated by a binary zero signal from port 182 of the CPU, the amplifier provides relatively low gain because a resistor 184 received all the feed back current. However, when a binary 1 signal is supplied from port 182, the amplifier provides the relatively high gain because resistor 184 is in parallel with a resistor 186. Capacitor 188 ensures that amplifier 22 amplifies only AC signals. The CPU selects the gain to best utilize the range of the amplifier and A/D converter.

Next, CPU 28 directs the selection decoder 61 to deliver a binary 1 signal to NAND gate 160 and AND gate 164 by transmitting a binary zero pulse to inverter gate 161 so that the voltages at each end of resistor 20 are sequentially supplied to the first side of capacitor 152 and the resultant, centered voltages are applied to the positive input of amplifier 222. The output of amplifier 222 is smoothed by a capacitor 29 (FIG. 2) and indicates the voltage across resistor 20 due to either charge or discharge of the battery cells. The voltage is ready by CPU 28 at the output of the A/D converter.

It should be noted that a non-switching amplifier may be utilized for amplifier 22.

Figure 6:
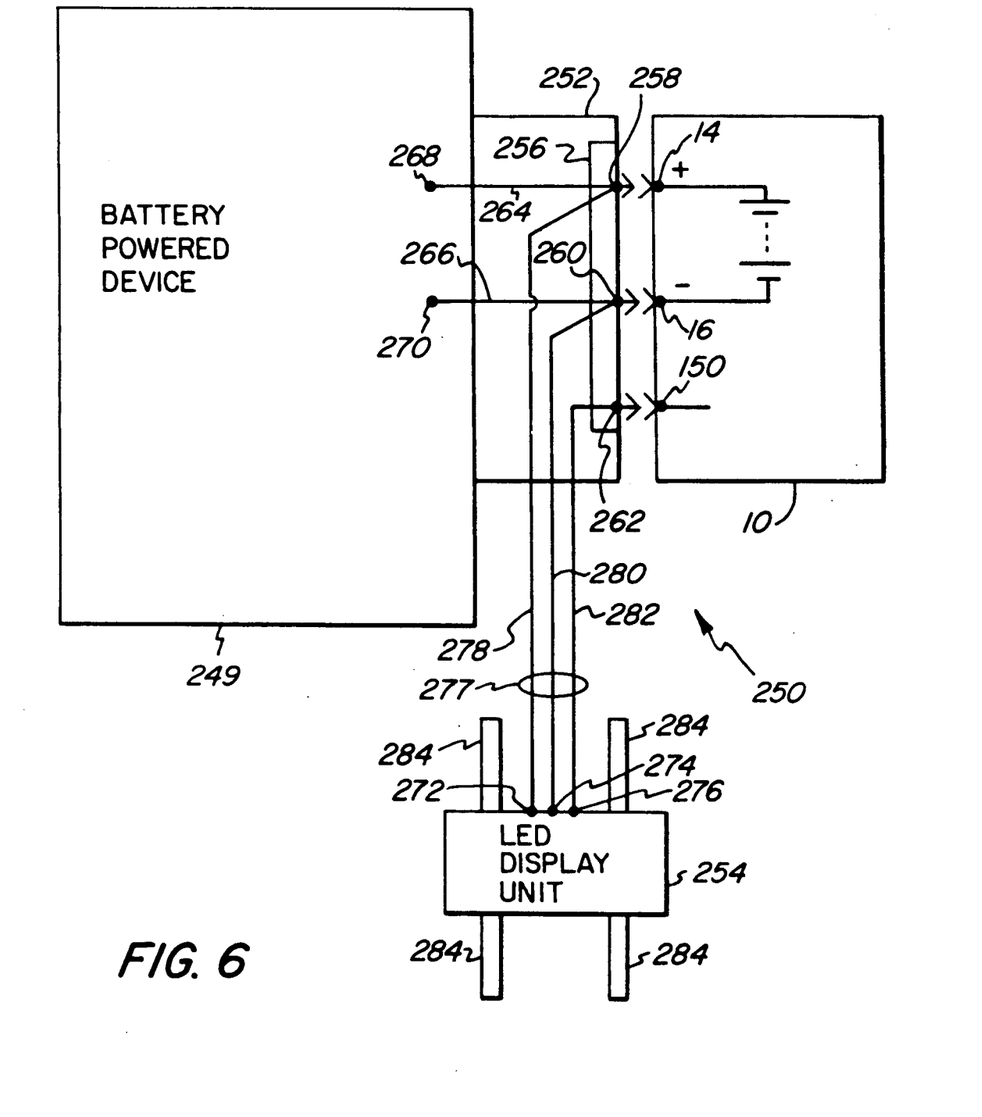
FIG. 6 is a simplified circuit diagram of the battery pack shown in FIG. 1, an attachment for use with the battery pack for displaying the charge in the batteries in the battery pack and a device being powered by the battery pack 10.

Referring now to FIG. 6 there is shown a simplified schematic view of battery pack 10, a device 249 to be powered by battery pack 10 and an attachment 250 for electrically and mechanically coupling battery pack 10 to device 249 and providing a display of the charge remaining in batteries 12. Device 249 may be, for example, a television camera.

Attachment 250 comprises a bracket 252 and LED display unit 254.

Bracket 252 is attached by any suitable means such as screws (not shown) to the housing on device 249. Bracket 252 is adapted to be detachably mounted by any suitable means such as screws (not shown) to the housing of battery pack 10.

Bracket 252 has an electrical connector 256 which includes a positive input terminal 258, a negative input terminal 260 and a fuel gauge input terminal 262 which are intended to connect to ports 14, 16 and 150, respectively on battery pack 10. Conductors 264 and 266 connect terminals 258 and 260, respectively, to the positive and negative terminals 268 and 270, respectively, on device 249.

LED display unit 254 has a positive input terminal 272, a negative input terminal 274 and a fuel gauge input terminal 276 is electrically connected to input terminals 258, 260 and 262 through a cable 277 made up of having three wires 278, 280 and 282. Display unit 272 may be removably mounted on device 249 at a desired location using straps 284 having pads of hooks and loops (i.e. Velcro) or other suitable means.

Figure 7:
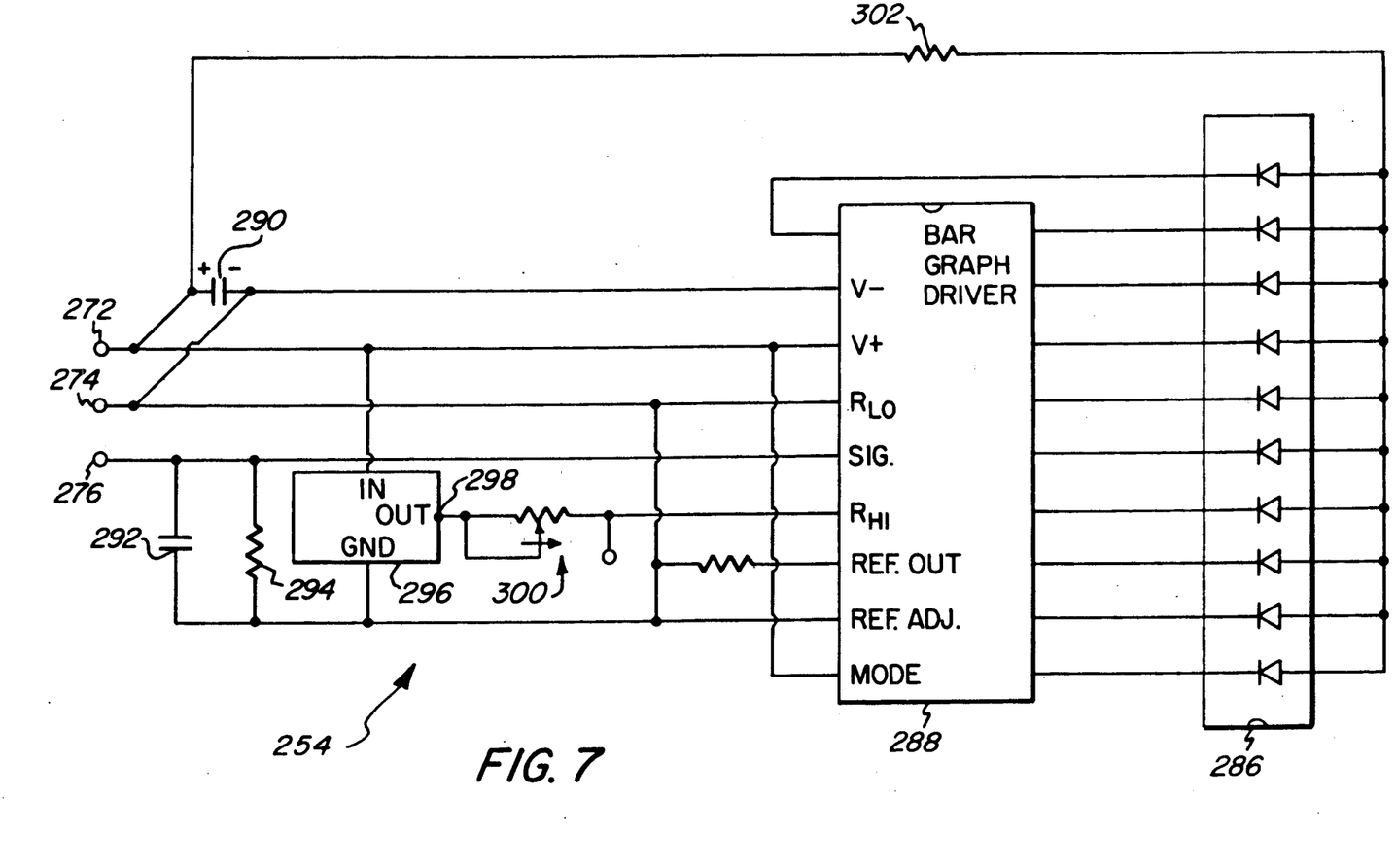
FIG. 7 is a detailed circuit diagram of the display unit in the attachment in FIG. 6.

Referring now to FIG. 7 there is shown a detailed circuit diagram of display unit 254.

As can be seen, LED display unit 254 includes a bank of ten LED's 286 which are driven by a bar graph driver 288. Bank of LED's 272 may be, for example, a Hewlett Packett Model Number HLCP-J100 unit. Bar graph driver 288 may be, for example, a National Semiconductor chip number LN4M 3914N. Bar graph driver 288 is basically a group of ten voltage comparators, the reference of each of which is tied to one of the taps on a voltage divider having ten taps.

Display unit 272 further includes associated circuitry, the associated circuitry comprising a noise filtering capacitor 290, a capacitor 292 and resistor 294 which also serve to filter out noise, a three terminal 5 volt regulator 296 which outputs 5 volts at its output terminal 298, a potentiometer 300 which sets the high end of the reference voltage divider string in bar graph driver 288 and a resistor 302 which is used to set the reference output current.

In use the state of charge is determined by the number of LED's that are lit, the number being lit being a function of the analog voltage received from fuel gauge port 150 on battery pack 10.

As can be appreciated, attachment 250 is intended to be used with battery pack 10 when battery pack 10 is supplying power to a battery powered device which is not equipped to receive the analog signal from port 150 and then produce a reading corresponding to the battery charge; however, attachment 250 can also be used, if desired, with battery pack 10 when it is not connected to a battey powered device (i.e. is sitting on the shelf etc.).

Figure 8:
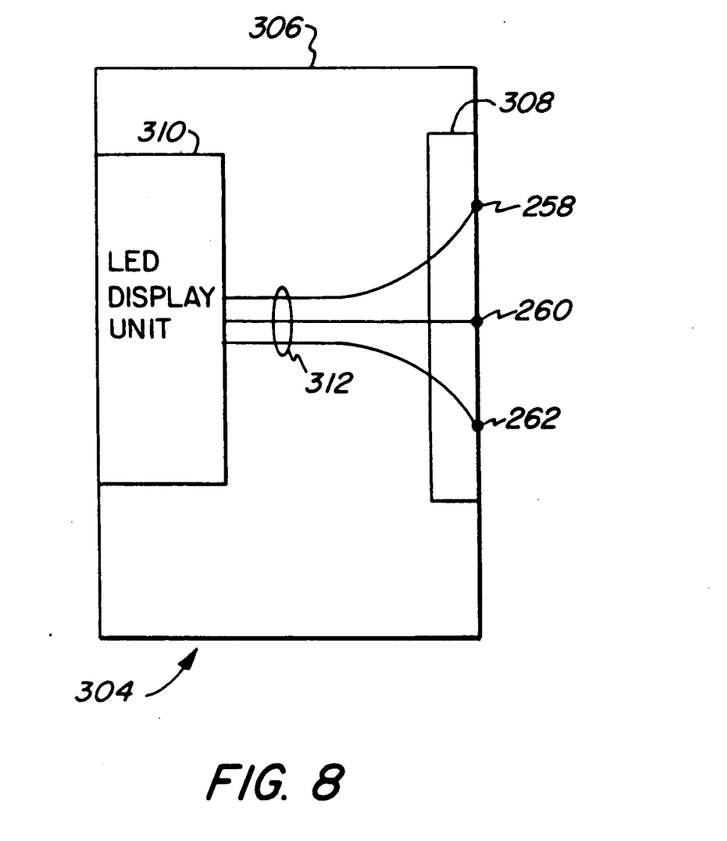
FIG. 8 is a simplified circuit diagram of a modification of the attachment shown in FIG. 6.

Referring now to FIG. 8 there is shown a modification of attachment 250 wherein the display unit is on the bracket rather than being remote from the bracket, the attachment in the modification being identified by reference numeral 304. Attachment 304 includes a bracket 306 having a connector 308 which is identical to connector 256. A display unit 310 which is identical to display unit 254 is mounted in bracket 306 and connected to connector 308 by a three wire cable 312 which is similar to cable 277 but shorter in length. Bracket is adapted to be detachably mounted on battery pack 10 by any suitable means. As can be appreciated, attachment 304 is intended to be used with battery pack 10 when it is not connected to a battery powered device.

The embodiments of the present invention is intended to be merely exemplary and those skilled in the art shall be able to make numerous variations and modifications to it without departing from the spirit of the present invention. All such variations and modifications are intended to be without the scope of the present invention as defined in the appended claims.

What I claim is:

1. A battery system for use with a battery powered device comprising:
 a. a battery pack, said battery pack including:
  i. a plurality of battery cells;
  ii. positive and negative terminals serially coupled to said battery cells, said positive terminal being adapted to deliver output current to a load and receive input current in the direction of charging current:
  iii. circuit means coupled to said positive and negative terminals and producing at an analog output terminal an analog output signal related to the state of charge of the battery cells; and
 b. display means separate from said battery pack and said battery powered device and electrically coupled to said analog output terminal for producing a display indicating the state of charge of said battery cells in accordance with said analog output signal.

2. The battery system of claim 1 and wherein the display means comprises an LED display unit.

3. The battery system of claim 2 and wherein the LED display unit comprises a bank of LED's and a bar graph driver for driving the bank of LED's, the number of LED's lit being a function of the analog output signal.

4. The battery system of claim 1 and wherein the display means comprises a bracket, an electrical connector mounted on the bracket and a LED display, said LED display being mounted on the bracket and electrically coupled to said electrical connector.

5. The battery system of claim 4 and wherein the display means further includes cable means for coupling the connector to a device being powered by the battery pack.

6. The battery system of claim 5, and wherein the display means includes first cable means for coupling the connector to the battery pack and second cable means for coupling the connector to a device to be powered by the battery pack.

7. The battery system of claim 5 and wherein the display means comprises an LED display unit.

8. The battery system of claim 7 and wherein the LED display unit includes a bank of LED's and a driver for driving the bank of LED's.

9. The battery system of claim 8 and wherein the bank of LED's comprises 10 LED's.

10. The battery system of claim 9 and wherein the circuit means in the battery pack includes a CPU.

11. A battery system comprising:
 a. a battery pack, said battery pack including:
  i. a plurality of battery cells;
  ii. positive and negative terminals serially coupled to said battery cells, said positive terminal being adapted to deliver output current to a load and receive input current in the direction of charging current;
  iii. means for producing an analog output signal representing battery charge; and
 b. an attachment, the attachment comprising:
  i. a bracket adapted to be connected to the battery pack; and
  ii. a display unit electrically coupled to said analog output terminal for producing a display indicating battery charge using said analog output signal.

12. A battery system comprising:
 a. a battery pack having a positive terminal, a negative terminal, an analog output signal terminal and battery means coupled between said positive terminal and said negative terminal, said analog output signal terminal outputting a signal related to the state of charge of said battery means,
 b. connector means having first, second and third terminals coupled to said positive terminal, said negative terminal and said analog output signal terminal, respectively and
 c. an analog display coupled to said first, second and third terminals of said connector for producing a display corresponding to said analog output signal.

13. The battery system of claim 12 and further including a bracket for holding said connector.

14. The battery system of claim 13 and wherein said display is mounted on said bracket.

15. The battery system of claim 13 and further including conductor means connected to said first and second terminal means on said connector and adapted to be connected to positive and negative terminals on a battery powered device.

16. The battery system of claim 12 and wherein the analog display includes a bank of LED's and a driver and wherein the number of LED's lit being a function of the analog output signal.

17. A battery system for use with a battery powered device comprising:
 a. a battery pack, said battery pack including:
  i. a plurality of battery cells;
  ii. positive and negative terminals serially coupled to said battery cells, said positive terminal being adapted to deliver output current to a load and receive input current in the direction of charging current;
  iii. circuit means coupled to said positive and negative terminals and producing at an output terminal an output signal related to the state of charge of the battery cells; and b. display means separate from said battery pack and said battery powered device and electrically coupled to said output terminal for producing a display indicating the state of charge of said battery cells in accordance with said output signal.

18. A battery pack comprising:

a. a plurality of battery cells;

b. positive and negative terminals serially coupled to said battery cells, said positive terminal being adapted to deliver output current to a load and receive input current in the direction of charging current;

c. circuit means coupled to said positive and negative terminals and producing at an output terminal an output signal related to the state of charge of the battery cells; and d. display means electrically coupled to said output terminal for producing a display indicating the state of charge of said battery cells in accordance with said output signal.

* * * * *